(12) United States Patent
Togawa (10) Patent No.: US 9,810,381 B2
(45) Date of Patent: Nov. 7, 2017

(54) LED MODULE

(71) Applicants: CITIZEN HOLDINGS CO., LTD., Nishitokyo-shi, Tokyo (JP); CITIZEN ELECTRONICS CO., LTD., Fujiyoshida-shi, Yamanashi (JP)

(72) Inventor: Masato Togawa, Fujiyoshida (JP)

(73) Assignees: CITIZEN WATCH CO., LTD., Tokyo (JP); CITIZEN ELECTRONICS CO., LTD., Tokyo (JP)

( * ) Notice: Subject to any disclaimer, the term of this patent is extended or adjusted under 35 U.S.C. 154(b) by 349 days.

(21) Appl. No.: 14/649,103

(22) PCT Filed: Nov. 29, 2013

(86) PCT No.: PCT/JP2013/082231
§ 371 (c)(1),
(2) Date: Jun. 2, 2015

(87) PCT Pub. No.: WO2014/087938
PCT Pub. Date: Jun. 12, 2014

(65) Prior Publication Data
US 2015/0316215 A1 Nov. 5, 2015

(30) Foreign Application Priority Data
Dec. 3, 2012 (JP) .................................. 2012-264321

(51) Int. Cl.
*H01L 33/00* (2010.01)
*F21K 99/00* (2016.01)
(Continued)

(52) U.S. Cl.
CPC .................. *F21K 9/30* (2013.01); *F21K 9/20* (2016.08); *F21K 9/60* (2016.08); *F21V 7/00* (2013.01);
(Continued)

(58) Field of Classification Search
None
See application file for complete search history.

(56) References Cited

U.S. PATENT DOCUMENTS 8,110,421 B2 2/2012 Sugizaki
2004/0080938 A1* 4/2004 Holman .................. F21S 8/08
362/231
(Continued)

FOREIGN PATENT DOCUMENTS

CN 102683335 9/2012
EP 2197051 6/2010
(Continued)

OTHER PUBLICATIONS

International Preliminary Report on Patentability and Written Opinion for International Application No. PCT/JP2013/082231 dated Jun. 9, 2015.
(Continued)

*Primary Examiner* — Evren Seven
(74) *Attorney, Agent, or Firm* — RatnerPrestia (57) ABSTRACT

Provided is an LED module which, even when CSP LED devices are arrayed adjacent to each other, emits light at a light emission color of a single LED device and is bright. An LED module includes a module substrate, first LED devices having a lateral surface which is configured of an optically transmissive face, and second LED devices having a lateral surface which is configured of a light blocking face. The first LED devices are mounted upon the module substrate adjacent to the second LED devices such that the translucent faces of the first LED devices and the light blocking faces of the second LED devices are in opposition.

14 Claims, 9 Drawing Sheets

(51) Int. Cl.
*F21V 7/00* (2006.01)
*H01L 33/50* (2010.01)
*H01L 33/58* (2010.01)
*H01L 25/075* (2006.01)
*F21K 9/20* (2016.01)
*F21K 9/60* (2016.01)
*H01L 33/46* (2010.01)
*H01L 33/56* (2010.01)
*F21Y 105/12* (2016.01)
*F21Y 105/10* (2016.01)
*F21Y 103/10* (2016.01)
*F21Y 115/10* (2016.01)

(52) U.S. Cl.
CPC ........ *H01L 25/0753* (2013.01); *H01L 33/505* (2013.01); *H01L 33/58* (2013.01); *F21Y 2103/10* (2016.08); *F21Y 2105/10* (2016.08); *F21Y 2105/12* (2016.08); *F21Y 2115/10* (2016.08); *H01L 33/46* (2013.01); *H01L 33/56* (2013.01); *H01L 2924/0002* (2013.01)

(56) References Cited

U.S. PATENT DOCUMENTS

| | | | | |
|---|---|---|---|---|
| 2006/0055309 A1* | 3/2006 | Ono | ................... | H01L 25/0753 313/492 |
| 2010/0155766 A1* | 6/2010 | Ku | ......................... | H01L 24/48 257/99 |
| 2010/0163891 A1* | 7/2010 | Ku | ......................... | F21S 10/02 257/88 |
| 2011/0090423 A1* | 4/2011 | Wheatley | .......... | G02F 1/133605 349/62 |
| 2011/0175117 A1* | 7/2011 | Jagt | ........................ | H01L 33/44 257/88 |
| 2012/0305953 A1* | 12/2012 | Bertram | ................. | F21K 9/135 257/89 |
| 2014/0098529 A1* | 4/2014 | Hata | .................... | H05K 1/0274 362/231 |

FOREIGN PATENT DOCUMENTS

| | | |
|---|---|---|
| EP | 2296179 | 3/2011 |
| EP | 2383780 | 11/2011 |
| EP | 2398051 | 12/2011 |
| JP | 06224469 | 8/1994 |
| JP | 2005158958 | 6/2005 |
| JP | 2005209852 | 8/2005 |
| JP | 2010141176 | 6/2010 |
| JP | 2011159812 | 8/2011 |
| JP | 2012227470 | 11/2012 |

OTHER PUBLICATIONS

Extended European Search Report dated Jun. 1, 2016 for European Application No. 13860330.3, 5 pages.
International Search Report dated Jan. 7, 2014 in International Application No. PCT/JP2013/082231.

* cited by examiner

LED MODULE

CROSS REFERENCE TO RELATED APPLICATIONS

This is the U.S. National Phase application of PCT/JP2013/082231, filed Nov. 29, 2013, which claims priority to Japanese Patent Application No. 2012-264321, filed Dec. 3, 2012, the disclosures of each of these applications being incorporated herein by reference in their entireties for all purposes.

FIELD OF THE INVENTION

The present invention relates to an LED module in which LED devices, each in packaged form containing an LED die, are mounted on a module substrate.

BACKGROUND OF THE INVENTION

With an increasing demand for higher brightness, the size of LED dies as bare chips has also been increasing, and nowadays, LED dies measuring up to 1 mm by 0.5 to 1 mm in area size are commercially available. Since this area size is about the same as that of other chip components such as resistors, there has developed a need for an LED device constructed by packaging an LED die with a resin or the like to have about the same area size as the LED die itself. Such a package is sometimes called a chip size package (hereinafter abbreviated CSP) as it directly reflects the size of the LED die. CSP has the advantage of small mounting area and a reduced amount of packaging material. CPS has the further advantage of being able to provide greater freedom in the design of lighting equipment, etc., because the number of components to be mounted on the mother substrate can be easily changed according to the required brightness.

Figure 14:
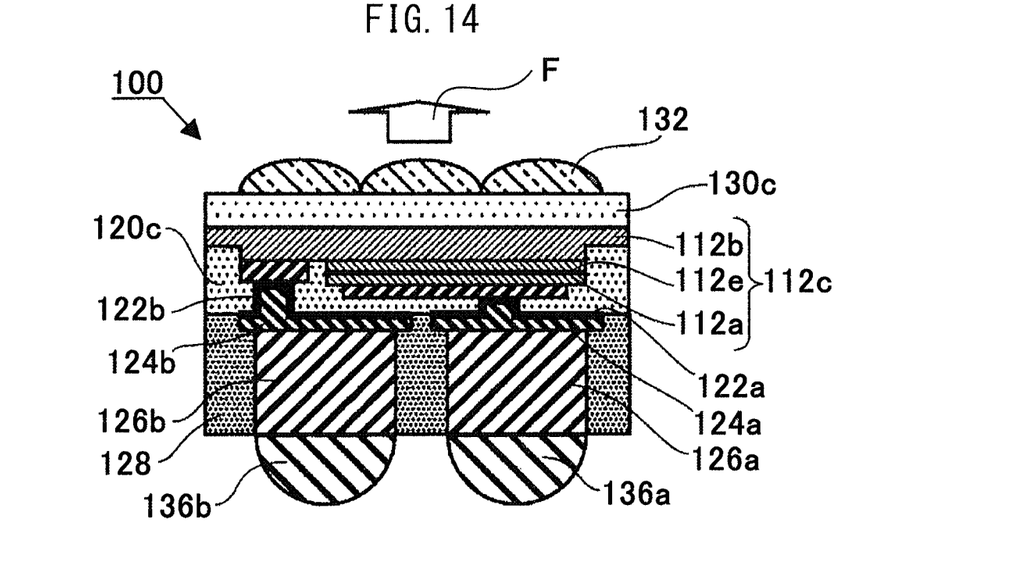
FIG. 14 is a cross-sectional view of an LED device 100 according to a first prior art example.

FIG. 14 is a cross-sectional view of a light-emitting device 100 (LED device) implemented in CSP form according to a first prior art example.

The light-emitting device 100 shown in FIG. 14 is an ultimate form of CSP in which the chip size of the LED die is identical with the outer plan shape of the package, and this LED device is the same one as that shown in FIG. 6 in patent document 1. In FIG. 14, a phosphor layer 130c and a lens 132 are formed one on top of the other on the upper surface of a multilayered structure 112c (of semiconductor layers). Seed metals 122a and 122b remaining unetched when a common electrode was formed by electrolytic plating, copper wiring layers 124a and 124b, and columnar copper pillars 126a and 126b formed by electrolytic plating are located on the underside of the multilayered structure 112c.

The multilayered structure 112c is made up of a p-type clad layer 112b, a light-emitting layer 112e, and an n-type clad layer 112a, and the lower surface of the multilayered structure 112c is covered with an insulating layer 120c having openings in designated portions. Solder balls 136a and 136b are attached to the bottoms of the respective copper pillars 126a and 126b. A reinforcing resin 128 is filled into the space separating the copper pillars 126a and 126b.

The area size of the light-emitting device 100 shown in FIG. 14 is identical with the area size of the multilayered structure 112c. The light-emitting device 100 is one that is diced from a wafer on which a plurality of light-emitting devices 100 have been produced in a rectangular array; such a package is the smallest one among the group of products categorized as CSPs, and is therefore sometimes called a wafer-level package (WLP). In the light-emitting device 100, since the transparent insulating substrate initially present on the multilayered structure 112c (see FIG. 2 paragraph 0026 in patent document 1) has been removed, light emitted from the light-emitting layer 112e is allowed to emerge only in the upward direction (arrow F). Therefore, the phosphor layer 130c is provided only on the upper surface of the LED device 100.

In the LED device 100 of FIG. 14, a laser is used to remove the transparent insulating substrate, but this requires large-scale fabrication equipment and increases the complexity of the fabrication process. Furthermore, in the LED device 100, since the phosphor layer 130c is formed at the wafer level, it is not possible to address variations in light emission characteristics arising among the individual LED dies produced on the wafer. This leads to the problem that it is difficult to manage the color of emission.

In view of the above problem, the present inventor experimentally produced a flip-chip LED device as an LED device that is compact in size and yet easy to fabricate and whose color of emission is easy to manage; to achieve this, the transparent insulating substrate was left unremoved, and the side faces of the transparent insulating substrate as well as the side faces of the semiconductor layer formed on the lower surface of the transparent insulating substrate were covered with a white reflective member, while the upper surface of the transparent insulating substrate and the upper end of the white reflective member were covered with a phosphor sheet (refer to patent document 2).

Figure 15:
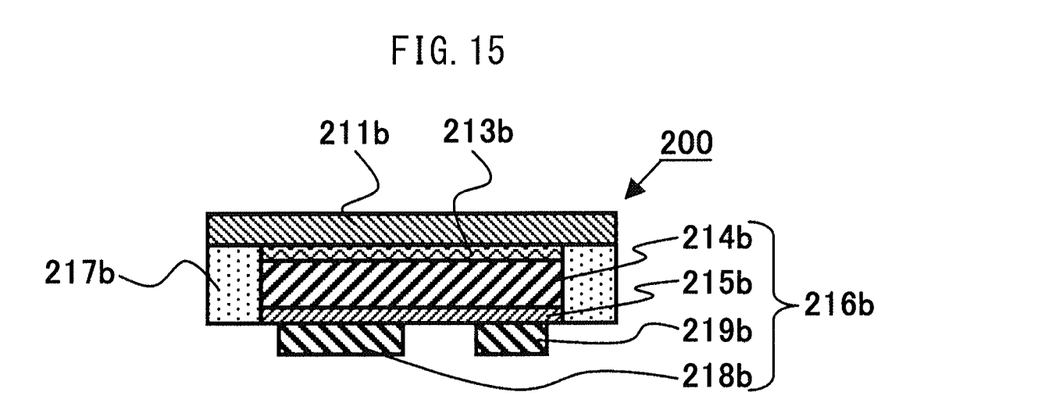
FIG. 15 is a cross-sectional view of an LED device 200 according to a second prior art example.

FIG. 15 is a cross-sectional view of an LED device 200 according to a second prior art example. The LED device 200 shown here is disclosed in patent document 2.

The LED device 200 is constructed from an LED die 216b having a sapphire substrate 214b (transparent insulating substrate) and a semiconductor layer 215b formed on the lower surface thereof, and includes a white reflective member 217b formed on the side faces of the LED die 216b, and a phosphor sheet 211b, formed on the upper surface of the LED die 216b including the white reflective member 217b, for wavelength conversion of emitted light. An adhesive layer 213b is interposed between the phosphor sheet 211b and the sapphire substrate 214b which are thus bonded together. Protruding electrodes 218b and 219b, which are connected to the semiconductor layer 215b of the LED die 216b, are an anode and a cathode, respectively, and serve as external connecting electrodes for connecting to a mother substrate or a module substrate. The mother substrate refers to a substrate on which the LED device 200 is mounted along with other electronic components such as resistors and capacitors. The module substrate refers to a substrate which is contained in an LED module constructed as a light-emitting component and on which a large number of LED devices are mounted.

Since the phosphor sheet 211b can be changed according to the light emission characteristics of the individual LED die 216b, the color of emission of the LED device 200 is easy to manage; further, since the white reflective member 217b can serve the purpose of providing the required characteristics such as light blocking and reflection and since its thickness is reduced to 100 μm or less, the LED device 200 can be made compact in size. Furthermore, the LED device 200 is easy to fabricate, because a batch fabrication method can be employed in which processing is performed on a large number of LED dies 216b arranged in an array on a wafer which is eventually diced into individual LED devices 200. Since each individual LED device 200 is small in size, a further advantage is that the LED devices can be arranged at a small pitch and thus packed in high density on a module substrate to construct an LED module.

PATENT DOCUMENTS

Patent document 1: Japanese Unexamined Patent Publication No. 2010-141176
Patent document 2: Japanese Unexamined Patent Publication No. 2012-227470

SUMMARY OF THE INVENTION

However, when an LED module was constructed by mounting the LED devices 200 in close proximity to each other on a module substrate as described above, the color emission (chromaticity coordinates) of the LED module was shifted from the color emission of each individual LED device 200. It was discovered that the cause was that a portion of light emitted from one LED device 200 entered another LED device 200 adjacent to it and excited phosphors in the other LED device 200. One possible solution to this problem is to provide a light blocking wall to prevent light emitted from each LED device 200 from propagating in lateral directions, but this not only makes the structure of the LED module complex but increases the amount of light loss due to light blocking, which is not desirable.

An object of the present invention is to provide an LED module that has low light loss and that does not cause any shift in color emission even when the LED module is constructed by mounting tiny LED devices in close proximity to one another.

There is provided an LED module includes a module substrate, a first LED device having a side face formed as an optically transmissive face, and a second LED device having a side face formed as a light blocking face, wherein the first LED device and the second LED device are arranged one adjacent to the other on the module substrate in such a manner that the optically transmissive face of the first LED device and the light blocking face of the second LED device oppose each other.

Preferably, in the LED module, of four side faces of the second LED device, only two opposed side faces are light blocking faces.

Preferably, in the LED module, the first LED device and the second LED device are arranged in a linear array.

Preferably, in the LED module, all four side faces of the second LED device are light blocking faces.

Preferably, in the LED module, a plurality of the first LED devices and a plurality of the second LED devices are respectively arranged in a staggered array.

Preferably, in the LED module, the light blocking face of the second LED device is formed from a white reflective member.

Preferably, in the LED module, the first LED device contains a first LED die having a first electrode disposed on a side thereof that faces the module substrate, the first LED die comprises a first semiconductor layer and a first transparent insulating substrate formed one on top of the other on the first electrode, and the first LED device is constructed by covering an upper face and side face of the first LED die with a phosphor resin, and the second LED device contains a second LED die having a second electrode disposed on a side thereof that faces the module substrate, the second LED die comprises a second semiconductor layer and a second transparent insulating substrate formed one on top of the other on the second electrode, and the second LED device is constructed by covering an upper face of the second LED die with a phosphor resin and the side face thereof with the white reflective member.

Preferably, in the LED module, the first electrode of the first LED device and the second electrode of the second LED device are each an external connecting electrode for connecting to an electrode formed on the module substrate.

Preferably, in the LED module, a bottom face of the first LED die contained in the first LED device is completely covered with the phosphor resin, except where the external connecting electrode is formed.

Preferably, in the LED module, a bottom face of the second LED die contained in the second LED device is completely covered with the white reflective member, except where the external connecting electrode is formed.

Preferably, in the LED module, the first LED die contained in the first LED device or the second LED die contained in the second LED device is flip-chip mounted on a submount substrate or a lead.

Preferably, in the LED module, a side face of the submount substrate or lead is completely covered with the phosphor resin.

Preferably, in the LED module, the phosphor resin used to cover the upper face of the first LED die contained in the first LED device or of the second LED die contained in the second LED device is formed in the shape of a phosphor sheet.

Preferably, in the LED module, the first LED device and the second LED device respectively emit light of different colors.

In an LED module which includes a module substrate and a plurality of LED devices mounted on the module substrate, the plurality of LED devices include a first LED device and a second LED device, the first LED device is located adjacent to the second LED device, and of the opposing side faces of the first and second LED devices, the side face of the first LED device is an optically transmissive face, while the side face of the second LED device is a light blocking face.

The first and second LED devices contained in the LED module each incorporate an LED die. When the module substrate with the first and second LED devices mounted thereon is viewed face up, the side and upper faces of the LED die in the first LED device are covered with an optically transmissive member formed from a phosphor resin, and therefore, the side face of the first LED device is an optically transmissive face. On the other hand, in the second LED device, the upper face of the LED die is covered with a phosphor resin, and a light blocking member such as a white reflective member is formed so as to enclose the sides of the LED die including the phosphor resin; therefore, the side face of the second LED device is a light blocking face. In the LED module of the present invention, the first LED device and the second LED device are arranged one adjacent to the other on the module substrate.

When the thus arranged LED devices are driven to emit light, the first LED device emits light not only in the upward direction but also in lateral directions. Most of the light emitted in lateral directions impinges on the module substrate as well as on the light blocking face formed from a white reflective member or the like on the adjacent second LED device, and the impinging light is partially absorbed and partly reflected. The light reflected by the surface of the module substrate or the light blocking face travels upward while undergoing further reflection and thus contributes to improving the light emission efficiency of the LED module.

On the other hand, the second LED device does not emit light in the direction of the first LED device because the side of the second LED device is provided with a light blocking face formed from a white reflective member or the like. Since the light thus emitted from the first LED device or the second LED device does not enter the second LED device or the first LED device located adjacent to each other, the shift (variation) in color emission does occur which would occur if the phosphors in the phosphor resin were excited by extraneous light.

More specifically, there is provided an LED module comprising a first LED device whose side face is an optically transmissive face formed from a phosphor resin and a second LED device whose side face is a light blocking face formed from a white reflective member or the like, wherein the first LED device and the second LED device are arranged one adjacent to the other on a module substrate. Since this arrangement serves to prevent light emitted from the side of the first LED device from entering the second LED device, there occurs no shift in chromaticity, nor does light emitted from the second LED device enter the first LED device, and since the light emission efficiency of the first LED device improves, the LED module can produce bright light. Thus, according to the LED module, bright light can be produced without causing any shift in chromaticity even when the LED module is constructed by arranging tiny LED devices in close proximity to one another.

DETAILED DESCRIPTION OF EMBODIMENTS OF THE INVENTION

Preferred embodiments of the present invention will be described in detail below with reference to the drawings. It will, however, be noted that the technical scope of the present invention is not limited by any particular embodiment described herein but extends to the inventions described in the appended claims and their equivalents. Further, throughout the drawings, the same or corresponding component elements are designated by the same reference numerals, and the description of such component elements, once given, will not be repeated thereafter. It will also be noted that the scale of the component elements is changed as necessary for illustrative purposes.

Figure 1:
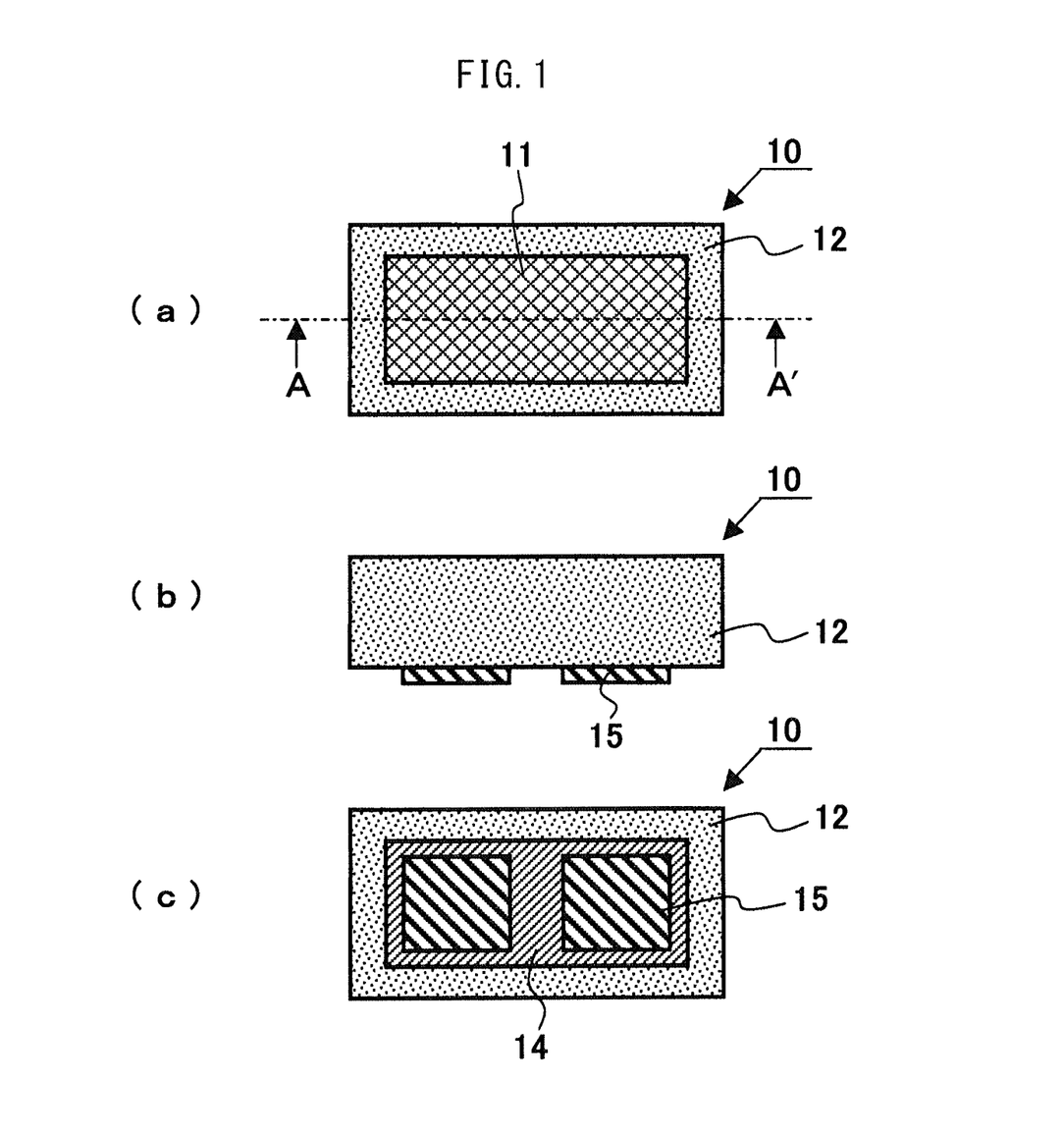
FIGS. 1(a) to 1(c) are diagrams showing the external appearance of an LED device 10 contained in an LED module 50.

FIG. 1 shows the external appearance of an LED device 10 (first LED device) contained in an LED module 50 (see FIGS. 5 and 6); more specifically, FIG. 1(a) shows a top plan view, FIG. 1(b) shows a front view, and FIG. 1(c) shows a bottom view.

As shown in FIG. 1(a), when the LED device 10 is viewed from the top, a rectangular frame formed from a phosphor resin 12 and a phosphor sheet 11 enclosed therein are seen. The phosphor sheet 11 is a form of phosphor resin, but it is distinguished from the phosphor resin 12 by the position where it is attached to the LED die 16 (see FIG. 2) and by the way how it is attached or formed (the same applies hereinafter). As shown in FIG. 1(b), when the LED device 10 is viewed from the front, the phosphor resin 12 and two electrodes 15 protruding therebelow are seen. As shown in FIG. 1(c), when the LED device 10 is viewed from the bottom, the rectangular frame formed from the phosphor resin 12 is seen along with a semiconductor layer 14 enclosed therein, and the two electrodes 15 are seen inside the semiconductor layer 14.

Figure 2:
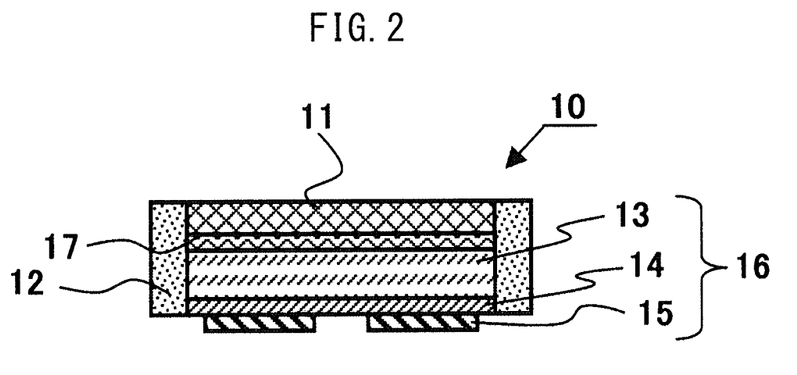
FIG. 2 is a cross-sectional view taken along line AA' in FIG. 1(a).

FIG. 2 is a cross-sectional view taken along line AA' in FIG. 1(a).

As shown in FIG. 2, in the LED device 10, the top of the LED die 16 is covered with the phosphor sheet 11, and the sides of the LED die 16 as well as the sides of the phosphor sheet 11 are covered with the phosphor resin 12. The LED die 16 comprises a sapphire substrate 13 (transparent insulating substrate) in addition to the semiconductor layer 14 and the two electrodes 15, and the semiconductor layer 14 and the sapphire substrate 13 are formed one on top of the other on the electrodes 15. An adhesive member 17 is interposed between the sapphire substrate 13 and the phosphor sheet 11. The phosphor sheet 11 and the phosphor resin 12 both have the function of wavelength-converting the blue light of the LED die 16 into white light. The phosphor resin 12 forms optically transmissive faces as the side faces of the LED device 10.

The phosphor sheet 11 is formed by mixing fine phosphor particles into a phenyl-based silicone resin and kneading the mixture into the shape of a sheet, and has a thickness of about 100 to 300 μm. If it is desired to reduce loss due to concentration quenching, the phosphor sheet 11 is formed thicker. The phosphor resin 12 is formed by mixing fine phosphor particles into a silicone resin and by kneading and thermally curing the mixture, and has a width of about 100 μm. The adhesive member 17 is formed from a thermosetting silicone adhesive material and has a thickness of about 100 μm. Because of the provision of the frame formed from the phosphor resin 12, if the area size of the LED die 16 is 0.8 mm×0.3 mm, for example, then the area size of the LED device 10 is 1.0 mm×0.5 mm, thus making the overall size easy to handle by a surface mounter.

The sapphire substrate 13 of the LED die 16 is about 80 to 120 μm in thickness. The semiconductor layer 14 formed on the lower surface of the sapphire substrate 13 is about 10 μm in thickness and includes a p-type semiconductor layer and an n-type semiconductor layer, and the junction between them serves as the light-emitting layer. An interlayer insulating film and a protective film are formed on the underside of the semiconductor layer 14, and the electrodes 15 are formed on the protective film. The two electrodes 15 are an anode and a cathode, respectively, and are connected to the p-type semiconductor layer and the n-type semiconductor layer via interconnections formed on the interlayer insulating film. The electrodes 15 are external connecting electrodes for connecting to a mother substrate on which other electronic components such as resistors and capacitors are mounted or to a module substrate 51 (see FIGS. 5 and 6), and each electrode has a gold layer on its surface for soldering. The electrodes 15 are each chosen to have a thickness of several hundreds of nanometers to several tens of micrometers.

Figure 3:
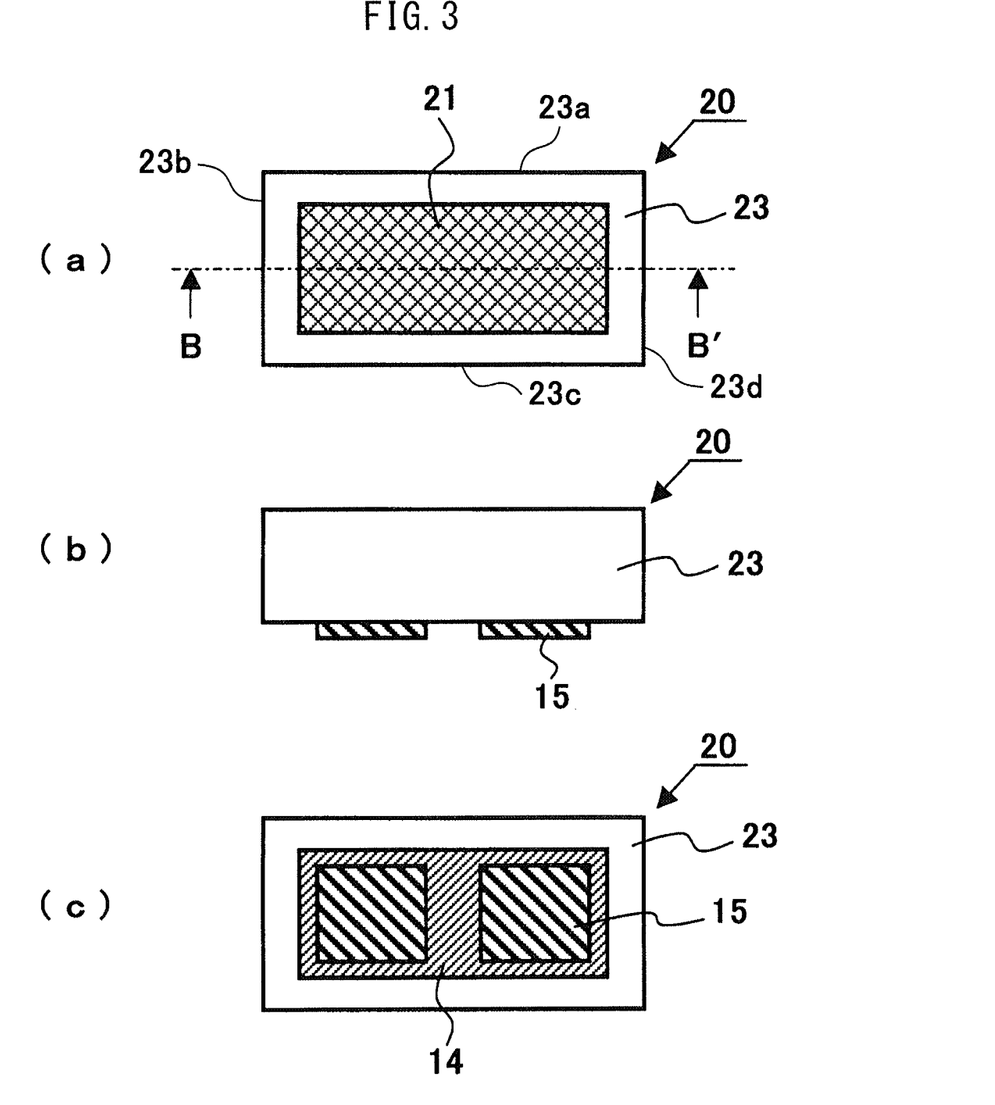
FIGS. 3(a) to 3(c) are diagrams showing the external appearance of an LED device 20 contained in the LED module 50.

FIG. 3 shows the external appearance of an LED device 20 (second LED device) contained in the LED module 50 (see FIGS. 5 and 6); more specifically, FIG. 3(a) shows a top plan view, FIG. 3(b) shows a front view, and FIG. 3(c) shows a bottom view.

As shown in FIG. 3(a), when the LED device 20 is viewed from the top, a rectangular frame formed from a white reflective member 23 and a phosphor sheet 21 enclosed therein are seen. As shown in FIG. 3(b), when the LED device 20 is viewed from the front, the white reflective member 23 and two electrodes 15 protruding therebelow are seen. As shown in FIG. 3(c), when the LED device 20 is viewed from the bottom, the rectangular frame formed from the white reflective member 23 is seen along with a semiconductor layer 14 enclosed therein, and the two electrodes 15 are seen inside the semiconductor layer 14.

Figure 4:
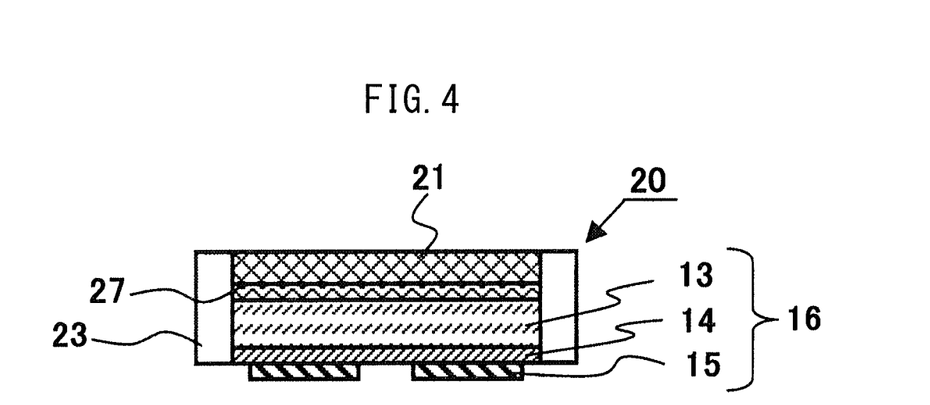
FIG. 4 is a cross-sectional view taken along line BB' in FIG. 3(a).

FIG. 4 is a cross-sectional view taken along line BB' in FIG. 3(a).

As shown in FIG. 4, in the LED device 20, the top of the LED die 16 is covered with the phosphor sheet 21, and the sides of the LED die 16 as well as the sides of the phosphor sheet 21 are covered with the white reflective member 23. The LED die 16 is the same as the LED die 16 contained in the LED device 10 shown in FIGS. 1 and 2, and an adhesive member 27 is interposed between the sapphire substrate 13 and the phosphor sheet 21. The phosphor sheet 21 has the function of wavelength-converting the blue light of the LED die 16 into white light. The white reflective member 23 forms light blocking faces as the side faces of the LED device 20.

The phosphor sheet 21 and the adhesive member 27 are respectively the same as the phosphor sheet 11 and the adhesive member 17 used in the LED device 10 shown in FIGS. 1 and 2. The white reflective member 23 is formed by mixing fine reflective particles such as titanium oxide or alumina into a silicone resin and by kneading and thermally curing the mixture, and has a width of about 100 μm. Since the frame formed from the white reflective member 23 is provided around the LED die 16, the LED device 20 is identical in area size and height to the LED device 10.

Figure 5:
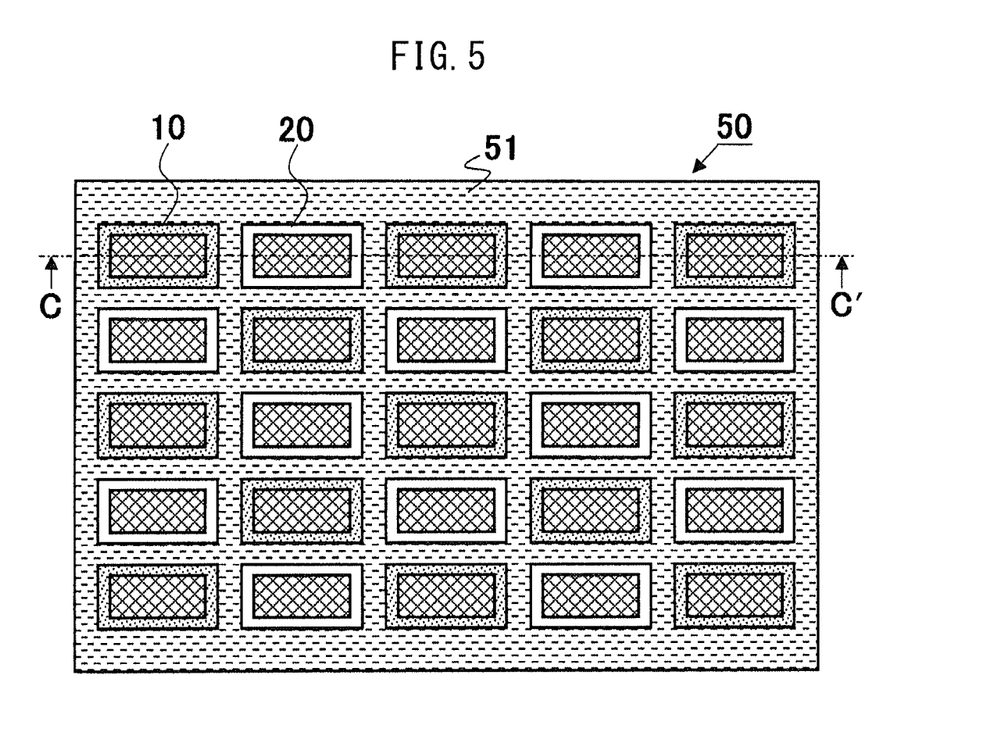
FIG. 5 is a top plan view of the LED module 50.

FIG. 5 is a top plan view of the LED module 50.

As shown in FIG. 5, in the LED module 50, a plurality of LED devices 10 and 20 are mounted on the module substrate 51. The LED devices 10 are arranged alternately with the LED devices 20 on the module substrate 51. More specifically, on the module substrate 51, no two LED devices 10 are adjacent to each other, nor are any two LED devices 20 adjacent to each other. In other words, any one LED device 10 is located adjacent to at least one of the LED devices 20. The LED devices 10 and the LED devices 20 are respectively arranged in a staggered array, forming as a whole a checkerboard pattern. Other electronic components such as resistors and capacitors may be mounted on the module substrate 51.

Figure 6:
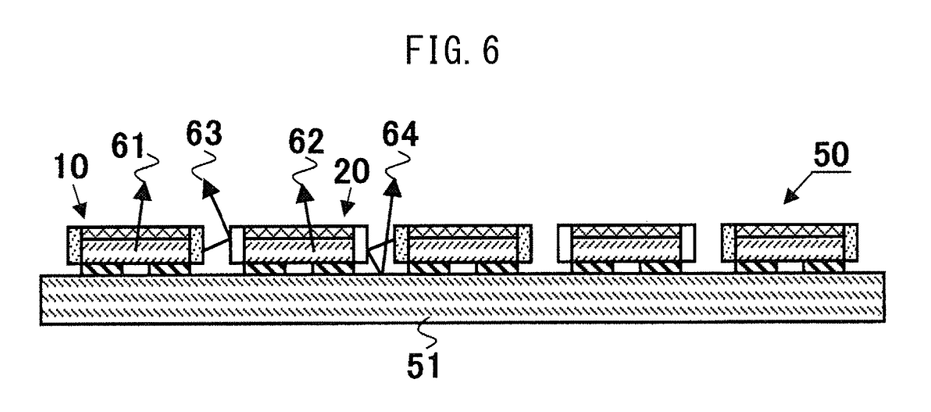
FIG. 6 is a cross-sectional view taken along line CC' in FIG. 5.

FIG. 6 is a cross-sectional view taken along CC' in FIG. 5.

As shown in FIG. 6, the LED devices 10 and 20 mounted on the module substrate 51 emit light rays 61 and 62 upward. The LED devices 10, whose side faces are covered with the optically transmissive phosphor resin 12 (see FIGS. 1 and 2), emit light rays 63 and 64 in lateral directions as well. The light ray 63 is reflected by the light blocking face of the white reflective member 23 (see FIGS. 3 and 4) formed on the side of the adjacent LED device 20, and is thus directed upward. On the other hand, the light ray 64 is first reflected downward by the light blocking face of the white reflective member 23 of the adjacent LED device 20 and is then reflected upward by the surface of the module substrate 51. There are other light rays emitted from the side faces of the LED devices 10 and reflected upward by the surface of the module substrate 51, but these light rays are not shown here.

As described above, when the LED devices 10 and 20 are driven to emit light, the LED devices 10 emit light not only in the upward direction but also in lateral directions, while on the other hand, the LED devices 20 emit light only in the upward direction. Since the LED devices 10 alternate with the LED devices 20, most of the light emitted in lateral directions from each LED device 10 is reflected by the surface of the module substrate 51 or by the white reflective member 23 of its adjacent LED device 20, and a portion of the reflected light is directed directly upward, while the remainder of the light travels upward while undergoing further reflection.

Since the light emitted from any LED device 10 or 20 does not enter its adjacent LED device 20 or 10, the shift (variation) in color emission does not occur which would occur if the phosphors in the phosphor resin were excited by extraneous light. Each LED device 10, whose side faces are optically transmissive due to the absence of a light blocking member or reflective member, has a good light emission efficiency, and the LED module 50 containing such LED devices 10 emits bright light. The side faces of each LED device 20, which are capable of both blocking and reflecting light, efficiently reflect some of the light emitted from the side faces of its adjacent LED devices 10 and thus contribute to increasing the brightness of the LED module 50.

In the LED module 50, the LED devices 10 (first LED devices) and the LED devices 20 (second LED devices) are arranged in a repeating fashion in the order of LED device 10, LED device 20, LED device 10, LED device 20, and so on in vertical and horizontal directions in FIG. 5. However, to prevent the shift (variation) in color emission, each LED device 10 need only be flanked by an LED device 20. Therefore, the LED devices may be arranged on the module substrate 11, for example, in a repeating fashion in the order of LED device 10, LED device 20, LED device 20, LED device 10, LED device 20, LED device 20, LED device 10, and so on in vertical and horizontal directions in FIG. 5.

The phosphor sheets 11 and 21 can be chosen to have the characteristics that match the light emission characteristics (peak wavelengths, etc.) of the respective LED dies 16. Since the phosphor sheets 11 and 21 are inexpensive and are easy to store, and their wavelength conversion characteristics can be adjusted easily, a plurality of phosphor sheets 11 and 21 having different wavelength conversion characteristics may be prepared in advance, and phosphor sheets having wavelength conversion characteristics that match the light emission characteristics (peak wavelengths, etc.) of the respective LED dies 16 may be selected as desired. This makes it easy to manage the color of emission of the LED module 50.

In the LED module 50, the phosphor sheets 11 and 21 have been described as being formed from the same material, but the phosphors contained in the phosphor sheet 11 may be made different from the phosphors contained in the phosphor sheet 21 so that the LED device 10 and the LED device 20 respectively emit light of different colors. For example, the LED device 10 may be tuned to emit daylight having a higher color temperature, and the LED device 20 may be tuned to emit warm light having a lower color temperature. In this case, it is more preferable if the LED module 50 has an operation mode in which both the LED devices 10 and 20 are lighted simultaneously and an operation mode in which only the LED device 20 is lighted. In this way, when both of the LED devices 10 and 20 are lighted simultaneously, active and bright lighting having a wide illumination range can be obtained, and when only the device 20 is lighted, lighting having a narrow illumination range and giving a warm impression can be obtained.

In the LED device 20, the white reflective member 23 directly covers the side face of the LED die 16. As a result, the light emitted from the side face of the LED die 16 is reflected by the white reflective member 23 back into the LED die 16. Since, in this case, the loss due to reabsorption in the semiconductor layer 14 occurs in addition to the loss due to the reflection, the light emission efficiency of the LED device 20 may drop. To address this, it is preferable to add an optically transmissive layer between the white reflective member 23 and the side face of the LED die 16, and it is more preferable to provide a sloping face on the inner wall of the white reflective member 23. By such provisions, if a portion of the light emitted from the side face of the LED die 16 is reflected back into the LED die 16, most of the light reflected back is transmitted upward through the optically transmissive layer, thus serving to prevent the light emission efficiency of the LED device 20 from dropping.

In the LED device 20, the frame formed from the white reflective member 23 is provided around the outer periphery to form light blocking faces on the side faces. However, the light blocking faces for preventing the color shift from occurring due to the intrusion of extraneous light are not limited to those formed from the white reflective member. For example, the light blocking faces may be formed, for example, from a black resin or a metal. However, when the light blocking faces are formed using the white reflective member, an improvement in light emission efficiency and a reduction in size can be achieved efficiently, compared with the case where the light blocking faces are formed using a black resin or a, metal.

Figure 7:
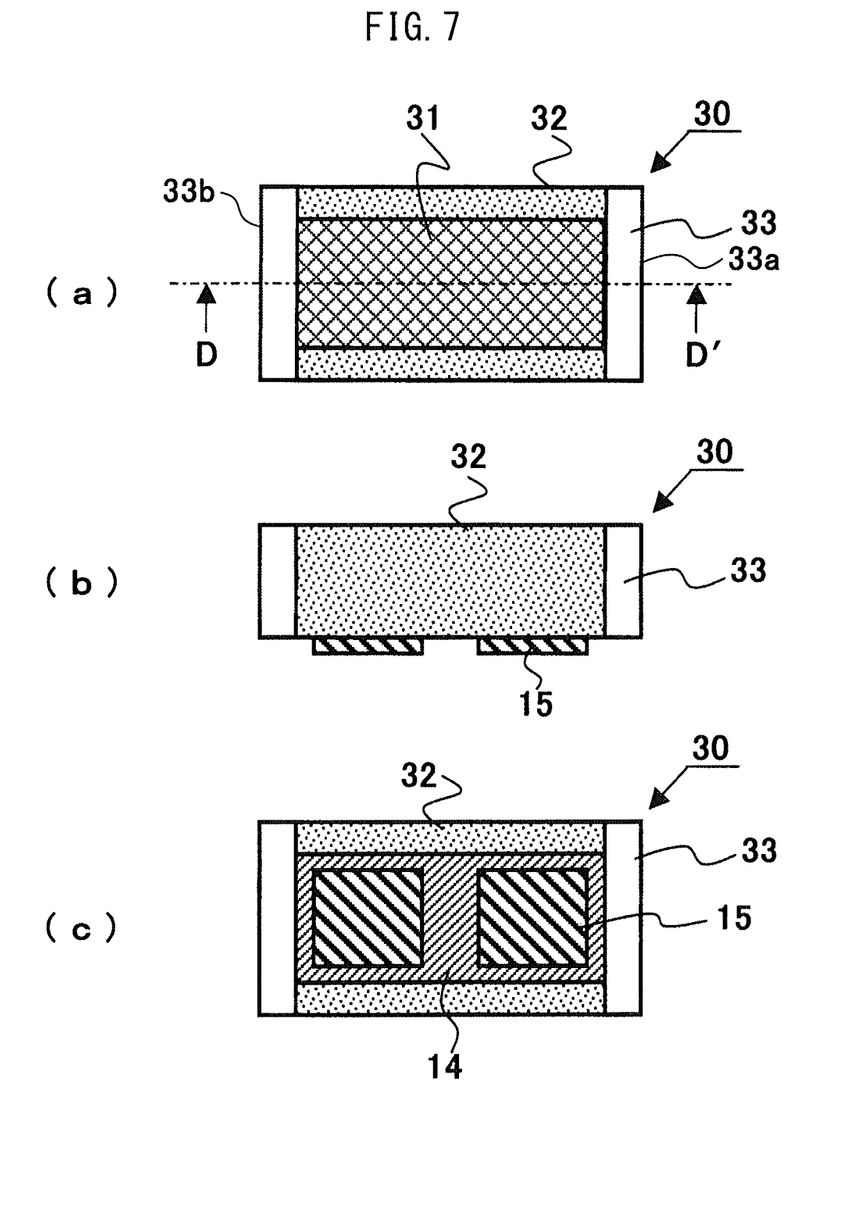
FIGS. 7(a) to 7(c) are diagrams showing the external appearance of an LED device 30 contained in an alternative LED module 90.

FIG. 7 is a diagram showing the external appearance of an LED device 30 contained in an alternative LED module 90 (see FIG. 9); more specifically, FIG. 7(a) shows a top plan view, FIG. 7(b) shows a front view, and FIG. 7(c) shows a bottom view.

In the LED module 50 shown in FIGS. 1 to 6, the LED devices 10 and 20 have been arranged in a two-dimensional array (see FIG. 5). By contrast, the LED module 90 is a linear module in which the LED devices 10 and 30 are arranged in a linear array (see FIG. 9). Similarly to the LED module 50, the LED module 90 contains the LED device 10 (first LED device, see FIGS. 1 and 2) and the LED device 30 (second LED device, see FIGS. 3 and 4). The LED device 10 is identical to the LED device 10 contained in the LED module 50, and therefore will not be further described herein.

As shown in FIG. 7(a), when the LED device 30 is viewed from the top, there are seen a rectangular phosphor sheet 31 and a phosphor resin 32 sandwiching the phosphor sheet 31 from the top and bottom thereof, and there is also seen a white reflective member 33 sandwiching the phosphor sheet 31 and the phosphor resin 32 from the left and right sides thereof. As shown in FIG. 7(b), when the LED device 30 is viewed from the front, the phosphor resin 32 and the white reflective member 33 sandwiching the phosphor resin 32 from the left and right sides thereof are seen along with two electrodes 15 protruding therebelow. As shown in FIG. 7(c), when the LED device 30 is viewed from the bottom, a semiconductor layer 14 and the two electrodes 15 located inside it are seen along with the phosphor resin 32 sandwiching the semiconductor layer 14 from the top and bottom thereof and the white reflective member 33 sandwiching the semiconductor layer 14 and the phosphor resin 32 from the left and right sides thereof.

Figure 8:
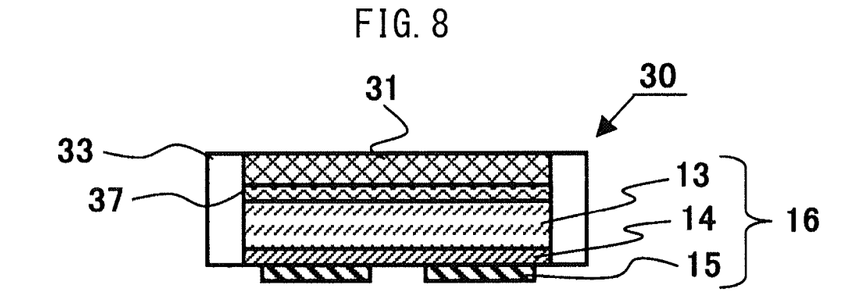
FIG. 8 is a cross-sectional view taken along line DD' in FIG. 7(a).

FIG. 8 is a cross-sectional view taken along DD' in FIG. 7(a).

As shown in FIG. 8, in the LED device 30, the top of the LED die 16 is covered with the phosphor sheet 31, and the sides of the LED die 16 as well as the sides of the phosphor sheet 31 are covered with the white reflective member 33. The sapphire substrate 13 of the LED die 16 and the phosphor sheet 31 are bonded together by an adhesive member 37.

The LED die 16, phosphor sheet 31, and adhesive member 37 contained in the LED device 30 are the same as the LED die 16, phosphor sheet 11 or 21, and adhesive member 17 or 27 contained in the LED device 10 or 20 shown in FIG. 2 or 4, respectively. The phosphor resin 32 and the white reflective member 33 are respectively formed from the same materials as the phosphor resin 12 and the white reflective member 23 shown in FIGS. 2 and 4. Similarly to the LED device 20 (see FIGS. 3 and 4), the LED device 30 is provided on its sides with light blocking faces formed from the white reflective resin 33. However, in the LED device 30, the light blocking faces are formed only on the two opposed sides.

Figure 9:
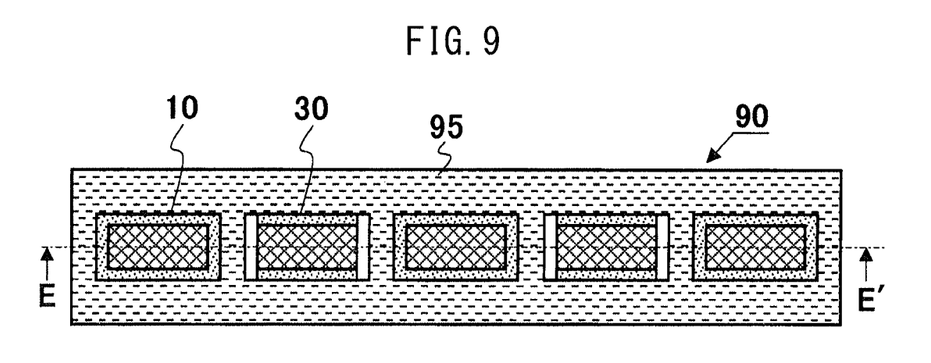
FIG. 9 is a top plan view of the LED module 90.

FIG. 9 is a top plan view of the LED module 90.

In the LED module 90, a plurality of LED devices 10 and 30 are mounted on a module substrate 95. The LED devices 10 and the LED devices 30 are arranged alternately with each another in a linear array on the module substrate 95. As a result, on the module substrate 95, no two LED devices 10 are adjacent to each other, nor are any two LED devices 30 adjacent to each other. The cross-sectional view taken along EE' in FIG. 9 is the same as the cross-sectional view shown in FIG. 6 (only the reference numeral is changed from 20 to 30).

The distribution of light in the lengthwise direction in FIG. 9 is the same as that shown in FIG. 6. In FIG. 9; however, not only the LED device 10 but the LED device 30 also emits light in the widthwise direction. The distribution of light in the widthwise direction of the LED module 90 becomes wide because the light emitted in the widthwise direction in FIG. 9 is only blocked by the module substrate 95. In the LED module 90, it would be possible to use the LED device 20 shown in FIGS. 3 and 4 instead of the LED device 30. The LED device 20 is simpler in structure and therefore easier to fabricate than the LED device 30, but the amount of emitted light decreases compared with the LED device 30. Accordingly, a linear LED module using the LED device 20 would become darker than the LED module 90.

Figure 10:
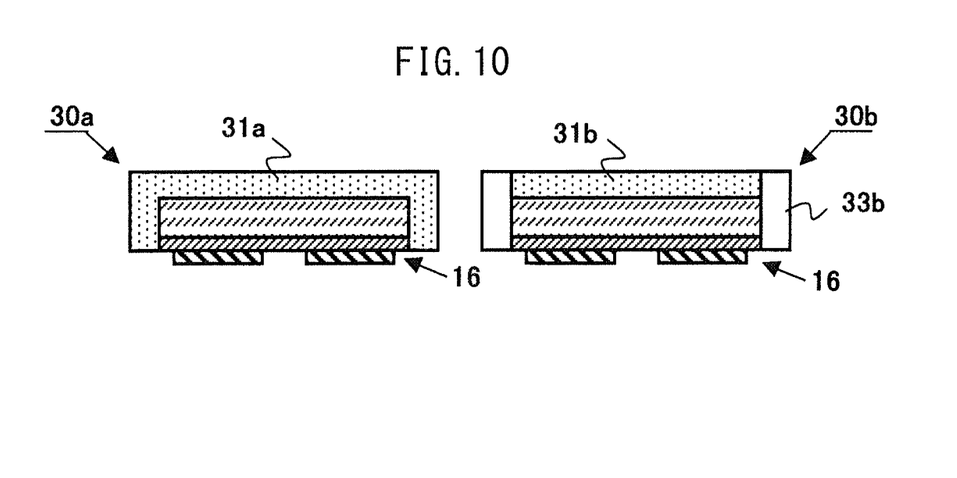
FIG. 10 is a cross-sectional view of an LED device 30a and an LED device 30b contained in another alternative LED module 91.

FIG. 10 is a cross-sectional view of an LED device 30a (first LED device) and an LED device 30b (second LED device) contained in another alternative LED module 91. The top plan view of the LED module 91 is substantially the same as that of the LED module 50 and is therefore not shown here.

In the LED devices 10, 20, and 30 used in the LED modules 50 and 90, the upper face of the LED die 16 is covered with the phosphor sheet 11, 21, 31. However, the member that covers the upper face of the LED die 16 need not necessarily be limited to the phosphor sheet, but any other suitable member capable of wavelength-converting the emitted light can be used. Therefore, in the LED device 30a used in the LED module 91, the upper and side faces of the LED die 16 are covered with a phosphor resin 31a. In the LED device 30b used in the LED module 91, on the other hand, the upper face of the LED die 16 is covered with a phosphor resin 31b, and the side faces of the LED die 16 including the phosphor resin 31b are covered with a white reflective member 33b. In the LED device 30a, the side faces formed from the phosphor resin 31a are optically transmissive faces, and in the LED device 30b, the side faces formed from the white reflective member 33b are light blocking faces. In the case of the LED device 30a, the fabrication process can be simplified because the phosphor resin 31a is formed to cover both the top and side faces simultaneously.

Figure 11:
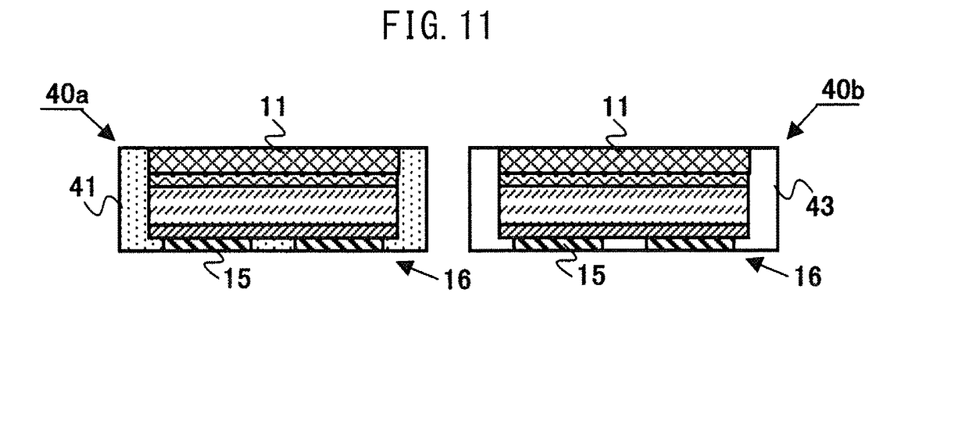
FIG. 11 is a cross-sectional view of an LED device 40a and an LED device 40b contained in still another alternative LED module 92.

FIG. 11 is a cross-sectional view of an LED device 40a (first LED device) and an LED device 40b (second LED device) contained in still another alternative LED module 92. The top plan view of the LED module 92 is substantially the same as that of the LED module 50 and is therefore not shown here.

In the LED devices 10, 20, and 30 used in the LED modules 50 and 90, the bottom face of the LED die 16 is exposed. However, the bottom face of the LED die 16 need not necessarily be exposed. Therefore, in the first LED device 40a and the second LED device 40b used in the LED module 92, the bottom face is covered with a phosphor resin 41 or a white reflective member 43, respectively. That is, the LED devices 40a and 40b differ from the LED devices 10 and 20 (see FIGS. 2 and 4) in that the bottom face of the LED die 16 contained in the LED device 40a and the bottom face of the LED die 16 contained in the LED device 40b are covered with the phosphor resin 41 and the white reflective member 43, respectively, everywhere except where the electrodes 15 are formed. When the bottom face of each LED die 16 is covered with the phosphor resin 41 or the white reflective member 43 everywhere except where the electrodes 15 are formed, the lower surface of the semiconductor layer 14 of the LED die 16 can be protected from contamination. Further, in the case of the LED device 40a, the light emission efficiency can be improved by wavelength-converting any light leaking from the bottom face of the LED die 16 to the module substrate side. On the other hand, in the case of the LED device 40b, unwanted light leakage can be eliminated by blocking light. In the LED device 40a, the side faces formed from the phosphor resin 41 are optically transmissive faces, and in the LED device 40b, the side faces formed from the white reflective member 43 are light blocking faces.

Figure 12:
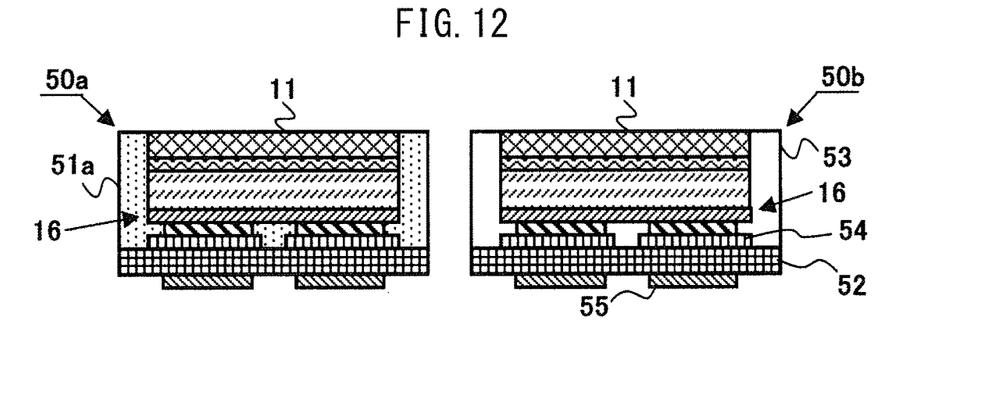
FIG. 12 is a cross-sectional view of an LED device 50a and an LED device 50b contained in a further alternative LED module 93.

FIG. 12 is a cross-sectional view of an LED device 50a (first LED device) and an LED device 50b (second LED device) contained in a further alternative LED module 93. The top plan view of the LED module 93 is substantially the same as that of the LED module 50 and is therefore not shown here.

In the LED devices 10, 20, and 30 used in the LED modules 50 and 90, the electrodes 15 formed on the bottom face of the LED die 16 are external connecting electrodes for connecting to the module substrate 51, 91 (see FIGS. 6 and 9). However, the electrodes on the bottom face of the LED die 16 need not necessarily be formed as external connecting electrodes. Therefore, the LED devices 50a and 50b used in the LED module 93 employ a submount substrate 52. That is, the LED devices 50a and 50b differ from the LED devices 10 and 20 (see FIGS. 2 and 4) in that the LED devices 50a and 50b are each flip-chip mounted on the submount substrate 52, as shown in FIG. 12. The submount substrate 52 is provided on its upper surface with internal connecting electrodes 54 and on its lower surface with external connecting electrodes 55, and the internal connecting electrodes 54 are connected to the external connecting electrodes 55 via plated-through holes not shown. By considering thermal conduction, etc., the base material of the submount substrate is selected, for example, from among a resin, a metal whose surface is treated for insulation in order to prevent short circuiting between interconnect elements such as the electrodes 54 and 55 and plated-through holes, and a ceramic material. In the LED devices 50a and 50b, a phosphor resin 51a and a white reflective member 53 are each formed so as to also lie on the bottom face of the LED die 16. In the LED device 50a, the side faces formed from the phosphor resin 51a are optically transmissive faces, and in the LED device 50b, the side faces formed from the white reflective member 53 are light blocking faces.

In the LED devices 50a and 50b, although the area size of the LED device is substantially identical with the area size of the LED die 16, not only is the LED die 16 protected from external contamination but any light leaking from the bottom of the LED die 16 is wavelength-converted or blocked, as in the LED devices 40a and 40b shown in FIG. 11. Furthermore, in the LED devices 50a and 50b, any external stress acting toward the LED die 16 can be alleviated.

Figure 13:
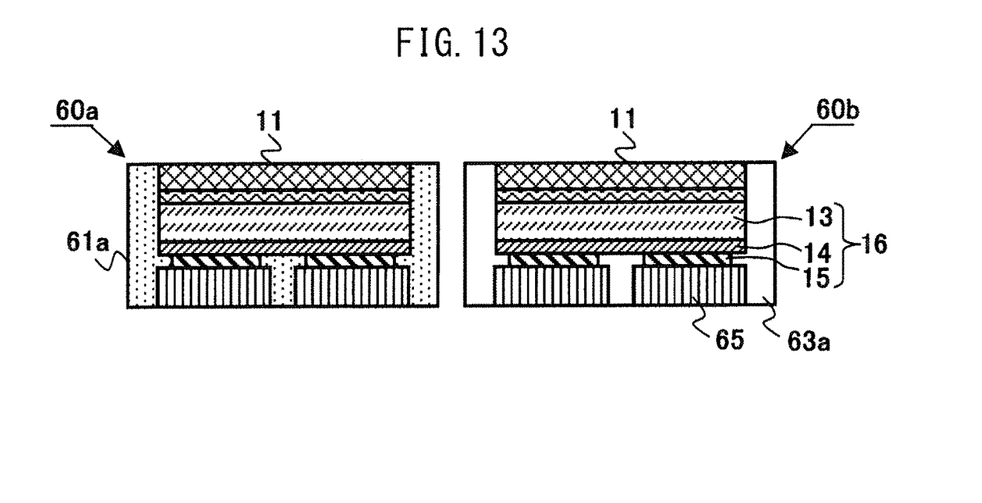
FIG. 13 is a cross-sectional view of an LED device 60a and an LED device 60b contained in a still further alternative LED module 94.

FIG. 13 is a cross-sectional view of an LED device 60a (first LED device) and an LED device 60b (second LED device) contained in a still further alternative LED module 94. The top plan view of the LED module 94 is substantially the same as that of the LED module 50 and is therefore not shown here.

In the LED devices 50a and 50b shown in FIG. 12, the LED die is flip-chip mounted on the submount substrate 52, but the LED die 16 may be mounted on leads. Therefore, in the LED devices 60a and 60b used in the LED module 94, the LED die 16 is mounted on leads 65. That is, the LED devices 50a and 50b differ from the LED devices 50a and 50b (see FIG. 12) in that, in each of the LED devices 60a and 60b, the LED die 16 is flip-chip mounted on the leads 65, as shown in FIG. 13. Each lead 65 is a metal such as Cu whose surface is plated with tin or the like, and the upper face serves as an internal connecting electrode, while the lower face serves as an external connecting electrode. In the LED devices 60a and 60b used in the LED module 94, the bottom face of the LED die 16 and the side faces of the leads 65 are covered with a phosphor resin 61a or a white reflective member 63a. In the LED device 60a, the side faces formed from the phosphor resin 61a are optically transmissive faces, and in the LED device 60b, the side faces formed from the white reflective member 63a are light blocking faces.

In the LED devices 60a and 60b, as in the LED devices 40a and 40b shown in FIG. 11, not only is the LED die 16 protected from external contamination but any light leaking from the bottom of the LED die 16 is wavelength-converted or blocked. Furthermore, in the LED devices 60a and 60b, any external stress acting toward the LED die 16 can be alleviated.

The LED devices 50a and 50b and the LED devices 60a and 60b shown in FIGS. 12 and 13, respectively, have each been described as being flip-chip mounted on the submount substrate 52 or the leads 65, respectively. However, as is well know in the construction of LED devices, each LED die may be mounted on a submount substrate or leads by die bonding, and the electrodes of the LED die may be connected to the electrodes on the substrate or to the leads by wires. However, flip-chip mounting, which does not require wires for mounting, is advantageous for reducing the overall size and eliminates the need for production equipment for wire bonding.

The LED modules 50 and 90 described above have each been constructed by mounting two kinds of LED devices, the first LED device (LED device 10) and the second LED device (LED device 20 or 30), one adjacent to the other on the module substrate 51, 91 (see FIGS. 5 and 9). Alternatively, only the same kind of LED devices may be mounted on the module substrate in close proximity to one another; in this case also, the arrangement can be made so that light emitted from one LED will not enter adjacent LEDs. For example, based on the LED device 20 shown in FIG. 3(*a*), an LED device 20' (not shown) is constructed by forming one pair of adjoining side faces (23*a* and 23*b*) as light blocking faces and the other pair of adjoining side faces (23*c* and 23*d*) as optically transmissive faces. Then, a plurality of such LED devices 20' are arranged horizontally and vertically on the module substrate so that the light blocking faces of each LED device face the optically transmissive faces of other LED devices. In this case, the LED module can be constructed using only one kind of LED device, but since the pairs of adjoining side faces of the LED device 20' have to be formed as light blocking faces and optically transmissive faces, respectively, the complexity of the fabrication process increases.

Similarly, based on the LED device 30 shown in FIG. 7(*a*), an LED device 30' is constructed by forming only one side face (33*a*) as a light blocking face and the other side face (33*b*) as an optically transmissive face. By just arranging a plurality of such LED devices 30' in a horizontal direction, a linear module free from any shift in chromaticity can be constructed using only the LED devices 30'.

DESCRIPTION OF THE REFERENCE NUMERALS 10, 30*a*, 40*a*, 50*a*, 60*a* . . . FIRST LED DEVICE
11, 21, 31 . . . PHOSPHOR SHEET
12, 32, 31*a*, 31*b*, 41, 51*a*, 61*a* . . . PHOSPHOR RESIN
13 . . . SAPPHIRE SUBSTRATE (TRANSPARENT INSULATING SUBSTRATE)
14 . . . SEMICONDUCTOR LAYER
15, 54, 55 . . . ELECTRODE
16 . . . LED DIE
17, 27, 37 . . . ADHESIVE MEMBER
20, 30, 30*b*, 40*b*, 50*b*, 60*b* . . . SECOND LED DEVICE
23, 33, 33*b*, 43, 53, 63*a* . . . WHITE REFLECTIVE MEMBER
50, 90, 91, 92, 93, 94 . . . LED MODULE
51, 59 . . . MODULE SUBSTRATE
52 . . . SUBMOUNT SUBSTRATE
61 TO 64 . . . LIGHT RAYS
65 . . . LEAD

What is claimed is:

1. An LED module comprising:
   a module substrate;
   a first LED device having a side face formed as an optically transmissive face; and
   a second LED device having a side face formed as a light blocking face,
   wherein said first LED device and said second LED device are arranged one adjacent to the other on said module substrate in such a manner that the optically transmissive face of said first LED device and the light blocking face of said second LED device oppose each other.

2. The LED module according to claim 1, wherein of four side faces of said second LED device, only two opposed side faces are light blocking faces.

3. The LED module according to claim 2, wherein said first LED device and said second LED device are arranged in a linear array.

4. The LED module according to claim 1, wherein all four side faces of said second LED device are light blocking faces.

5. The LED module according to claim 4, wherein a plurality of said first LED devices and a plurality of said second LED devices are respectively arranged in a staggered array.

6. The LED module according to claim 1, wherein the light blocking face of said second LED device is formed from a white reflective member.

7. The LED module according to claim 6, wherein said first LED device contains a first LED die having a first electrode disposed on a side thereof that faces said module substrate, said first LED die comprises a first semiconductor layer and a first transparent insulating substrate formed one on top of the other on said first electrode, and said first LED device is constructed by covering an upper face and side face of said first LED die with a phosphor resin, and
   said second LED device contains a second LED die having a second electrode disposed on a side thereof that faces said module substrate, said second LED die comprises a second semiconductor layer and a second transparent insulating substrate formed one on top of the other on said second electrode, and said second LED device is constructed by covering an upper face of said second LED die with a phosphor resin and the side face thereof with said white reflective member.

8. The LED module according to claim 7, wherein said first electrode of said first LED device and said second electrode of said second LED device are each an external connecting electrode for connecting to an electrode formed on said module substrate.

9. The LED module according to claim 8, wherein a bottom face of said first LED die contained in said first LED device is covered with said phosphor resin everywhere except where said external connecting electrode is formed.

10. The LED module according to claim 8, wherein a bottom face of said second LED die contained in said second LED device is covered with said white reflective member everywhere except where said external connecting electrode is formed.

11. The LED module according to claim 7, wherein said first LED die contained in said first LED device or said second LED die contained in said second LED device is flip-chip mounted on a submount substrate or a lead.

12. The LED module according to claim 11, wherein a side face of said submount substrate or lead is covered with said phosphor resin.

13. The LED module according to claim 7, wherein said phosphor resin used to cover the upper face of said first LED die contained in said first LED device or of said second LED die contained in said second LED device is formed in the shape of a phosphor sheet.

14. The LED module according to claim 1, wherein said first LED device and said second LED device respectively emit light of different colors.

\* \* \* \* \*